United States Patent [19]

Shinkawa et al.

[11] 4,008,438
[45] Feb. 15, 1977

[54] RAT-RACE MIXER CIRCUIT
[75] Inventors: Keiro Shinkawa; Chiuichi Sodeyama; Hirozi Shoyama, all of Yokohama, Japan
[73] Assignee: Hitachi, Ltd., Japan
[22] Filed: Oct. 28, 1975
[21] Appl. No.: 626,278
[30] Foreign Application Priority Data
Oct. 28, 1974 Japan .............. 49-123351
[52] U.S. Cl. .................. 325/446; 333/84 M; 321/69 W
[51] Int. Cl.² .......................... H04B 1/26
[58] Field of Search ......... 325/442, 445, 446, 449; 321/69 W; 333/84 M, 11

[56] References Cited
UNITED STATES PATENTS

| 3,512,091 | 5/1970 | Blixt et al. | 325/446 |
| 3,534,267 | 10/1970 | Hyltin | 325/445 |
| 3,624,508 | 11/1971 | Kach | 325/446 |
| 3,950,703 | 4/1976 | Reindel | 325/446 |

Primary Examiner—Robert L. Griffin
Assistant Examiner—Jin F. Ng
Attorney, Agent, or Firm—Craig & Antonelli

[57] ABSTRACT

A mixer circuit using a rat-race constituted by disposing microstrip lines on one surface of a substrate to provide a loop-shaped transmission line and four transmission lines connected to the loop. In the rat-race, two of the four transmission lines are disposed within the loop of the loop-shaped transmission line. A conductor penetrates the substrate at the center of the loop of the loop-shaped transmission line, and a pair of diodes are connected respectively between this conductor and the two transmission lines disposed within the loop so that an intermediate frequency signal obtained by subjecting a high frequency signal to frequency conversion can be derived from the conductor at the other surface side of the substrate.

3 Claims, 4 Drawing Figures

RAT-RACE MIXER CIRCUIT

BACKGROUND OF THE INVENTION

1. Field of the Invention

This invention relates to a mixer circuit for use in radio communication equipment, and more particularly to an improved mixer circuit using a rat-race formed by microstrip lines.

2. Description of the Prior Art

A 3-dB power distributor is frequently used in a mixer circuit which is provided for the frequency conversion of a signal having a very high frequency. A rat-race is conveniently used to serve as this 3-dB power distributor due to the fact that the rat-race can operate stably over a wide frequency range compared with conventional branch line couplers. This rat-race has, for example, a structure as disclosed by W. H. Leighton, Jr, et al in a paper entitled "Junction Reactance and Dimensional Tolerance Effects on X-Band 3dB directional Couplers" reported in IEEE TRANSACTION ON MICROWAVE THEORY AND TECHNIQUES, Vol. MTT-19, No. 10, October 1971, pp. 818 – 824. Briefly describing, the structure of this disclosed rat-race is such that a closed loop is formed by a microstrip line having a length which is three half the wavelength of a high frequency to be handled, and four microstrip lines having an impedance which is $1/\sqrt{2}$ times that of the microstrip line forming the closed loop are connected to the closed loop at intervals of quarter wavelengths starting from any desired point on the closed loop. This rat-race has such a property that, when a signal is applied by way of the first of these four lines, one half of the supplied power is transmitted to each of the second and fourth lines, while no signal is transmitted to the third line.

FIGS. 1 and 2 show principal parts of mixer circuits utilizing such a rat-race. These are examples of mixer circuits using the so-called microstrip lines formed by disposing a conductor in a desired circuit pattern on one surface of a substrate of electrical insulator having a conductor layer over the entire area of the other surface. In the mixer circuit shown in FIG. 1, microstrip lines 1, 2, 3, 4 and 5 constitute the rat-race. In the form shown in FIG. 1, the lines 3 and 5 have the same length and are connected at one end thereof to the line 1 and at the other end thereof to one terminal of diodes 6 and 7 respectively. Low-pass filters 8 and 9 are connected to the other terminal of the diodes 6 and 7 respectively for deriving intermediate frequency signals from the diodes 6 and 7. These diodes 6 and 7 are disposed in directions opposite to each other so that intermediate frequency signals of the same phase can be obtained by rotating the phase of a high frequency signal input by the rat-race. In order that the intermediate frequency signals can be derived from the low-pass filters 8 and 9, the impedance of the rat-race when viewed from the diodes 6 and 7 must be short-circuited against the frequency of the intermediate frequency signals. Therefore, when the lines 4 and 2 are selected as a high frequency signal input line and a local oscillation signal input line respectively, it is necessary to connect to the line 2 a stub filter 10 which is open-circuited against the local oscillation frequency and short-circuited against the intermediate frequency. The mixer circuit of the structure shown in FIG. 1 is however defective in that a signal combining circuit (not shown) for combining the intermediate frequency signal outputs of the low-pass filters 8 and 9 must be disposed to extend across the high frequency signal input line 4 in the space above the plane of the mixer circuit or such signal combining circuit must be formed by extending a lead wire to the area outside of the mixer circuit.

In the mixer circuit shown in FIG. 2, microstrip lines 1, 2, 3, 4 and 5 constitute the rat-race similarly, and diodes 6 and 7 are similarly connected at one terminal thereof to one end of the lines 3 and 5 respectively. In the form shown in FIG. 2, the diodes 6 and 7 are shorted to ground at the other terminal thereof, and a low-pass filter 13 is connected to the local oscillation signal input line 2 in order to avoid an undesirable power loss of a high frequency signal input applied by the line 4. In order that an intermediate frequency signal can be derived through this output filter 13, the circuit portions except the filter 13 must be open-circuited against the intermediate frequency when viewed from the diodes 6 and 7. Therefore, capacitive means 11 and 12, which are short-circuited against a high frequency and open-circuited against a low frequency, are connected in series with the input lines 2 and 4 respectively. Such capacitive means 11 and 12 are formed by cutting off a portion of suitable length from the respective lines 2 and 4. In the mixer circuit of the structure shown in FIG. 2, the intermediate frequency signals appearing from the diodes 6 and 7 are combined by the output filter 13 in the state in which a phase difference exists therebetween, and an undesirable reduction in the power of the output signal results due to the fact that the distance between the diode 6 and the output filter 13 differs from that between the diode 7 and the output filter 13. This adverse effect becomes more marked with the increase in the frequency of the intermediate frequency signal. Further, due to the fact that the output filter 13 is connected to the line 2 to which the local oscillation input of large power is applied, it is necessary to provide a plurality of filters in order to prevent appearance of the local oscillation frequency at the output terminal due to leakage.

The mixer circuits using the rat-race have such advantage that the local oscillation signal of large power which may be reflected by the diodes does not appear in the high frequency signal input line, in addition to such inherent advantage of the rat-race that it can operate stably over a wide frequency range. However, the known mixer circuit structures above described are defective in that the intermediate frequency signal output means cannot be disposed in the same plane as that of the rat-race and an external circuit must be additionally provided, or the output power loss increases with the increase in the frequency of the intermediate frequency signal.

SUMMARY OF THE INVENTION

It is an object of the present invention to provide an improved mixer circuit which utilizes fully the inherent advantage of rat-races.

Another object of the present invention is to provide a mixer circuit of simple structure in which an output circuit can be disposed in the plane of microstrip lines constituting the rat-race and which eliminates the necessity for especial provision of any wiring extending across the microstrip lines in the space above the plane of the rat-race constituted by these lines.

Still another object of the present invention is to provide a mixer circuit which can produce the desired output signal with improved efficiency in spite of a small size.

The mixer circuit according to the present invention which attains the above objects comprises a rat-race constituted by disposing, on one surface of a substrate of electrical insulator, a microstrip line forming a circular closed loop and four microstrip lines connected to this closed loop, and is featured by the fact that two of the four microstrip lines connected to the closed loop extend radially inward toward the center of the closed loop to be connected at the inner end thereof to respective detector diodes, a low-pass filter for bypassing a high frequency signal is inserted in an opening bored in the substrate at substantially the center of the closed loop, and the detector diodes are connected respectively between the low-pass filter and the inner end of the radially inwardly extending microstrip lines. The output signal is derived from the other surface side of the substrate through the low-pass filter.

DESCRIPTION OF THE PREFERRED EMBODIMENT

A preferred embodiment of the present invention will now be described in detail with reference to FIG. 3.

Figure 1:
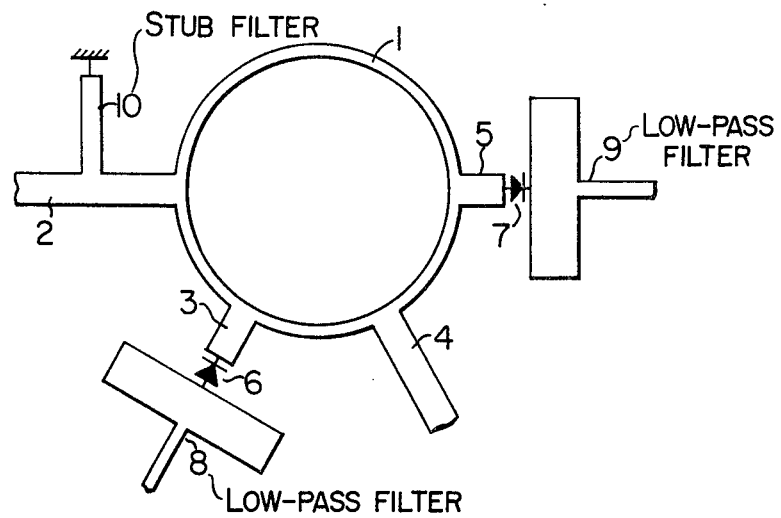
FIGS. 1 and 2 are circuit diagrams showing typical structures of a mixer circuit using a rat-race.
Figure 2:
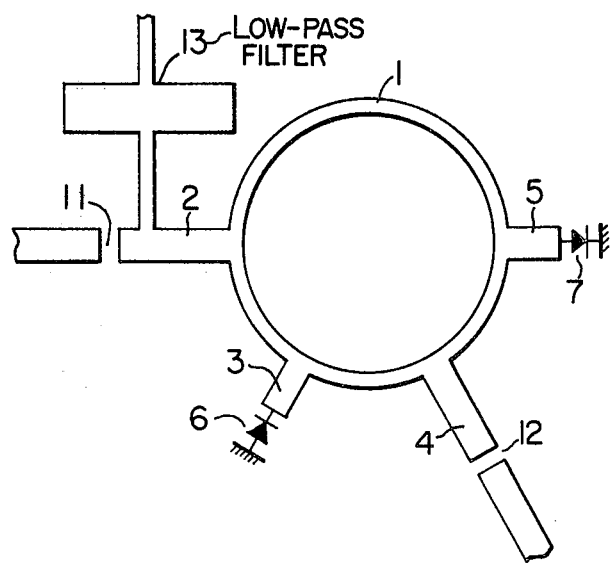
Figure 3:
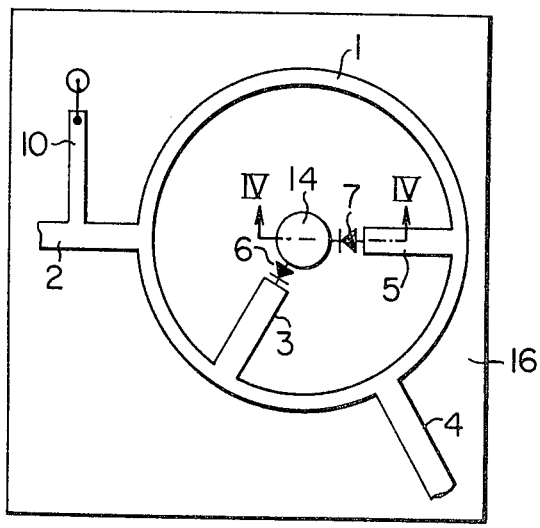
FIG. 3 is a circuit diagram showing a preferred embodiment of the present invention.

FIG. 3 shows principal parts of the mixer circuit according to the present invention. This mixer circuit is similar to those shown in FIGS. 1 and 2 in that microstrip lines constituting a rat-race are formed by disposing a conductor in a desired circuit pattern on one surface of a substrate of electrical insulator having a conductor layer over the entire area of the other surface.

Referring to FIG. 3, the rat-race formed on one surface of the substrate of electrical insulator includes a microstrip transmission line 1 forming a circular closed loop and four microstrip transmission lines 2, 3, 4 and 5 connected at one end thereof to the closed loop 1. The transmission lines 3 and 5 extend radially inward toward the center of the closed loop 1 unlike the prior art arrangements shown in FIGS. 1 and 2. A vertical opening is bored to extend through the substrate at substantially the center of the closed loop 1 to receive therein a low-pass filter 14 having an impedance which is short-circuited against a high frequency. Diodes 6 and 7 are disposed in directions opposite to each other to be connected respectively between this low-pass filter 14 and the transmission lines 3 and 5. A local oscillation signal is applied from a local oscillator (not shown) to the transmission line 2, and a received high frequency signal is applied to the transmission line 4 in a manner commonly well known in the art. Connected to the local oscillation signal input line 2 is a stub filter 10 which is short-circuited against the intermediate frequency signal and open-circuited against the local oscillation signal.

In operation, the high frequency signal input and local oscillation signal input transmitted by way of the transmission lines 4 and 2 respectively of the rat-race are distributed according to the power distribution characteristic of the rat-race and the distributed balves of -3 dB each are applied to the diodes 6 and 7. Intermediate frequency signals of the same phase having a frequency representing the frequency difference between the high frequency signal and the local oscillation signal appear from the diodes 6 and 7 since these diodes 6 and 7 are disposed in directions opposite to each other as above described. The impedance of the rat-race when viewed from the diodes 6 and 7 is short-circuited against the frequency of the intermediate frequency signals by the stub filter 10. Therefore, the intermediate frequency signals of the same phase produced by the diodes 6 and 7 can be effectively combined together by the low-pass filter 14 to provide a composite output which is delivered to the exterior. Further, this arrangement eliminates the prior art necessity for especial provision of an output signal line which extends across the line 2 or 4 in the space above the plane of the mixer circuit. The marked effect of the present invention is also exhibited when the relative functions of the transmission lines 2 and 4 are reversed and the high frequency signal and local oscillation signal are applied to the transmission lines 2 and 4 respectively.

Figure 4:
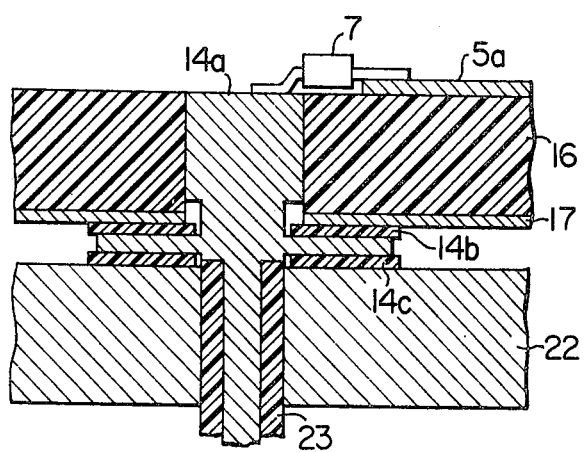
FIG. 4 is a sectional view showing the structure and arrangement of a low-pass filter preferably employed in the present invention.

FIG. 4 is a sectional view showing the structure and arrangement of one form of the low-pass filter 14 which delivers the output of the mixer circuit. Referring to FIG. 4, a substrate 16 of dielectric material has a predetermined thickness and a predetermined dielectric constant and is provided with an upper conductor 5a and a lower conductor 17 on the upper and lower surfaces respectively. A casing 22 of conductive material is disposed beneath this substrate 16 as shown. Aligned vertical openings extend through the substrate 16 and casing 22, and a bar conductor 14a is inserted into these aligned openings with the upper end thereof exposed on the upper surface of the substrate 16. A diode 7 is connected between the upper conductor 5a and the upper end of the bar conductor 14a. This bar conductor 14a is provided with a fin in the form of an annular disc at the portion intermediate between the substrate 16 and the casing 22, and a layer 14b of electrical insulator is interposed between the lower conductor 17 and the fin extending from the bar conductor 14a to provide a capacitance which is short-circuited against a high frequency. The lower portion of the bar conductor 14a is electrically insulated from the casing 22 by layers 14c and 23 of electrical insulator, and the lower end of the bar conductor 14a is connected to an external circuit so as to serve ac the low-pass filter 14 which is short-circuited against the high frequency. However, the structure of the low-pass filter is in no way limited to that illustrated in FIG. 4 and any other suitable structure may be employed in lieu of the illustrated structure.

It will be understood from the foregoing description that the present invention provides a mixer circuit using a rat-race constituted by disposing, on one surface of a substrate of electrical insulator, a microstrip line forming a circular closed loop and four microstrip lines connected to this closed loop, and is featured by the fact that two of the latter four microstrip lines connected to the closed loop extend radially inward toward the center of the closed loop to be connected at the inner end thereof to respective mixer diodes, an opening is bored in the substrate at substantially the center of the closed loop to receive therein a low-pass filter which is short-circuited against a high frequency, and the mixer diodes are connected respectively between the low-pass filter and the inner end of the radially inwardly extending microstrip lines. Therefore, the present invention eliminates the prior art necessity for especial provision of a separate circuit extending over the plane of the rat-race resulting in complexity of the circuit structure. Further, the present invention overcomes prior art defects including an undesirable reduction of the signal combining efficiency due to the phase difference of intermediate frequency outputs of the diodes. Furthermore, the mixer circuit according to the present invention is small in size compared with prior art ones.

We claim:

1. A mixer circuit for converting a high frequency signal into an intermediate frequency signal comprising:
   a substrate of electrical insulator having a predetermined thickness and a predetermined dielectric constant and formed with a conductor layer over the entire area of one of the surfaces thereof, said substrate being provided with a single opening extending therethrough;
   a rat-race circuit constituted by disposing microstrip lines in a desired circuit pattern on the other surface of said substrate to provide a first transmission line forming a circular closed loop having the center registering substantially with said opening and having an overall circumferential length corresponding to three half the wavelength of the high frequency signal to be converted into the intermediate frequency signal, a second transmission line connected at one end thereof to said first transmission line and having an impedance which is $1/\sqrt{2}$ times the impedance of said first transmission line, and a third, a fourth and a fifth transmission line connected at one end thereof to said first transmission line in such a relationship that they are successively spaced apart from the connection point of said second transmission line in the above order along said first transmission line by an arcuate distance corresponding to one quarter the wavelength of the high frequency signal, said third, fourth and fifth transmission lines having an impedance equal to that of said second transmission line, the other end of said second and fourth transmission lines extending toward the exterior of said circular closed loop while the other end of said third and fifth transmission lines extending radially inward toward the center of said circular closed loop formed by said first transmission line;
   means for supplying the high frequency signal to be subject to frequency conversion to one of said second and fourth transmission lines in said rat-race circuit and supplying a local oscillation signal to the other said transmission line in said rat-race circuit;
   conductive means including a bar conductor inserted into said opening bored in said substrate at substantially the center of said circular closed loop formed by said first transmission line on said substrate; and
   a pair of diodes connected respectively between the portion of said bar conductor exposed from said opening and the inner end of said third and fifth transmission lines, one of said diodes being connected at the cathode thereof to said bar conductor while the other said diode being connected at the anode thereof to said bar conductor;
   whereby the intermediate frequency signal obtained by subjecting said high frequency signal to frequency conversion can be derived from said bar conductor at said one surface side of said substrate.

2. A mixer circuit as claimed in claim 1, wherein said conductive means constitutes a low-pass filter.

3. A mixer circuit as claimed in claim 1, wherein said conductive means constitutes a low-pass filter which comprises a metal conductor penetrating said substrate and a conductive strip disposed opposite to said conductor layer on said one surface of said substrate with a layer of electrical insulator interposed therebetween, said conductive strip being electrically connected to said metal conductor.

* * * * *